(12) United States Patent
Wang et al.

(10) Patent No.: US 11,545,619 B2
(45) Date of Patent: Jan. 3, 2023

(54) MEMORY DEVICE STRUCTURE AND METHOD FOR FORMING THE SAME

(71) Applicant: Taiwan Semiconductor Manufacturing Co., Ltd., Hsinchu (TW)

(72) Inventors: Hsing-Hsiang Wang, Hsinchu (TW); Han-Ting Lin, Hsinchu (TW); Yu-Feng Yin, Hsinchu (TW); Sin-Yi Yang, Taichung (TW); Chen-Jung Wang, Hsinchu (TW); Yin-Hao Wu, Taichung (TW); Kun-Yi Li, Hsinchu (TW); Meng-Chieh Wen, Kaohsiung (TW); Lin-Ting Lin, Taichung (TW); Jiann-Horng Lin, Hsinchu (TW); An-Shen Chang, Jubei (TW); Huan-Just Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 176 days.

(21) Appl. No.: 16/934,341

(22) Filed: Jul. 21, 2020

(65) Prior Publication Data
US 2022/0029091 A1    Jan. 27, 2022

(51) Int. Cl.
| H01L 43/08 | (2006.01) |
| H01L 27/22 | (2006.01) |
| H01L 43/10 | (2006.01) |
| H01L 43/12 | (2006.01) |
| H01L 43/02 | (2006.01) |

(52) U.S. Cl.
CPC ............ H01L 43/08 (2013.01); H01L 27/228 (2013.01); H01L 43/02 (2013.01); H01L 43/10 (2013.01); H01L 43/12 (2013.01)

(58) Field of Classification Search
CPC ............ H01F 10/3254; H01F 10/3259; H01F 10/3272; H01F 10/329; H01F 41/307; H01F 41/34; H01L 43/12; H01L 27/228; H01L 43/02; H01L 43/08; H01L 27/222; H01L 43/10; H01L 45/1675; H01L 21/31056; H01L 21/76802; H01L 21/76819; H01L 23/5226; H01L 23/528; H01L 27/105; H01L 27/2472; H01L 29/40; H01L 45/16; H01L 45/1616
See application file for complete search history.

(56) References Cited

U.S. PATENT DOCUMENTS

| 10,270,028 B1 * | 4/2019 | Tien ................... H01L 43/12 |
| 2017/0194557 A1 * | 7/2017 | Chuang ............... H01L 27/228 |

(Continued)

*Primary Examiner* — Mark W Tornow
*Assistant Examiner* — Priya M Rampersaud
(74) *Attorney, Agent, or Firm* — Birch, Stewart, Kolasch & Birch, LLP

(57) ABSTRACT

A method for forming a memory device structure is provided. The method includes providing a substrate, a first dielectric layer, a conductive via, a magnetic tunnel junction cell, a first etch stop layer, and a first spacer layer. The substrate has a first region and a second region, the first dielectric layer is over the substrate, the conductive via passes through the first dielectric layer over the first region. The method includes removing the first etch stop layer, which is not covered by the first spacer layer. The method includes removing the first dielectric layer, which is not covered by the first etch stop layer.

20 Claims, 17 Drawing Sheets

(56) References Cited

U.S. PATENT DOCUMENTS

| | | | |
|---|---|---|---|
| 2018/0097175 A1* | 4/2018 | Chuang | H01L 43/02 |
| 2019/0165258 A1* | 5/2019 | Peng | H01L 43/08 |
| 2020/0106009 A1* | 4/2020 | Wu | H01L 43/02 |
| 2020/0176041 A1* | 6/2020 | Shen | H01L 27/222 |

* cited by examiner

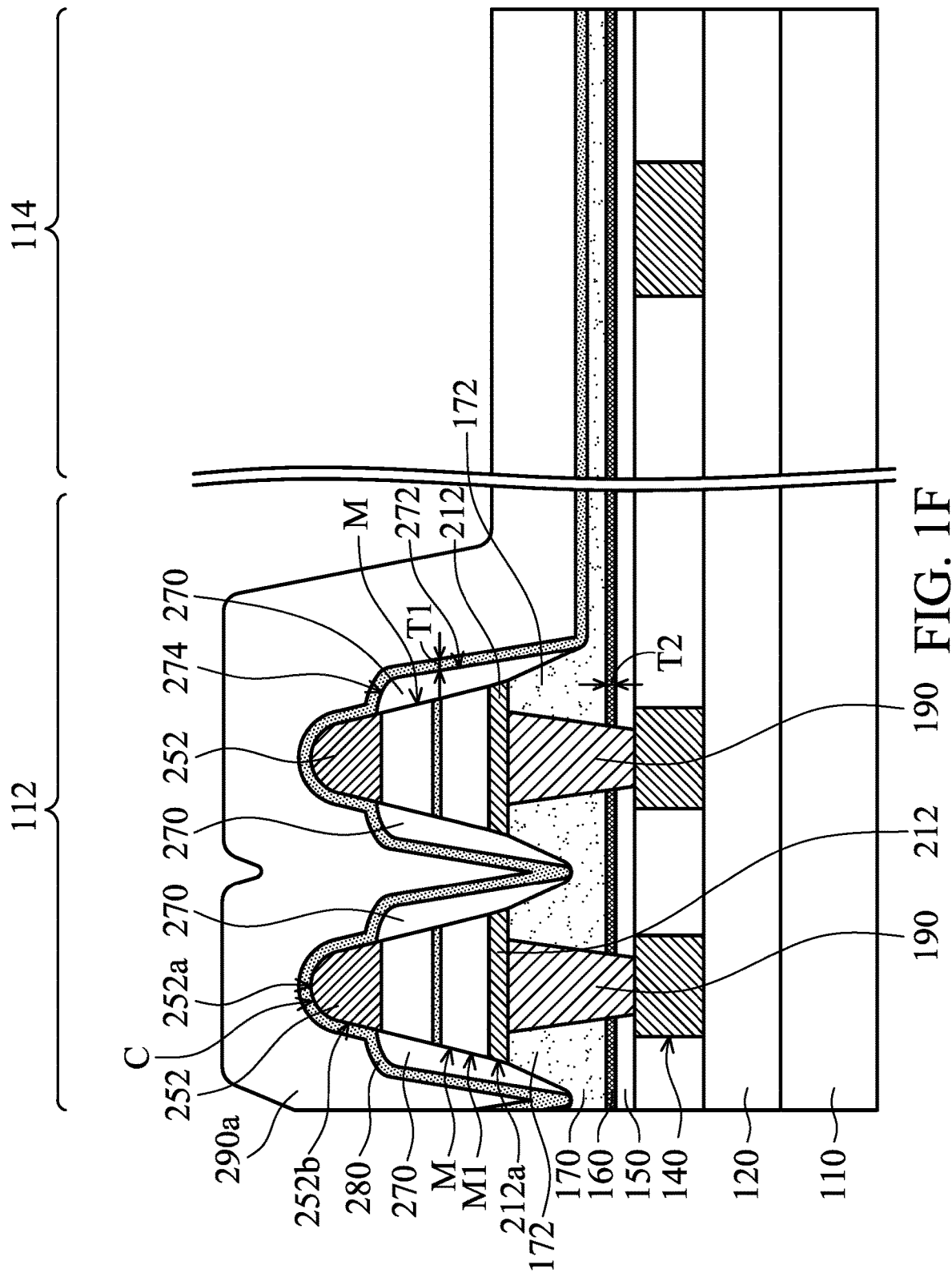

MEMORY DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

Semiconductor memories are used in IC for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

However, since feature sizes of semiconductor memories continue to decrease, fabrication processes continue to become more difficult to perform. Therefore, it is a challenge to form reliable semiconductor memories at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
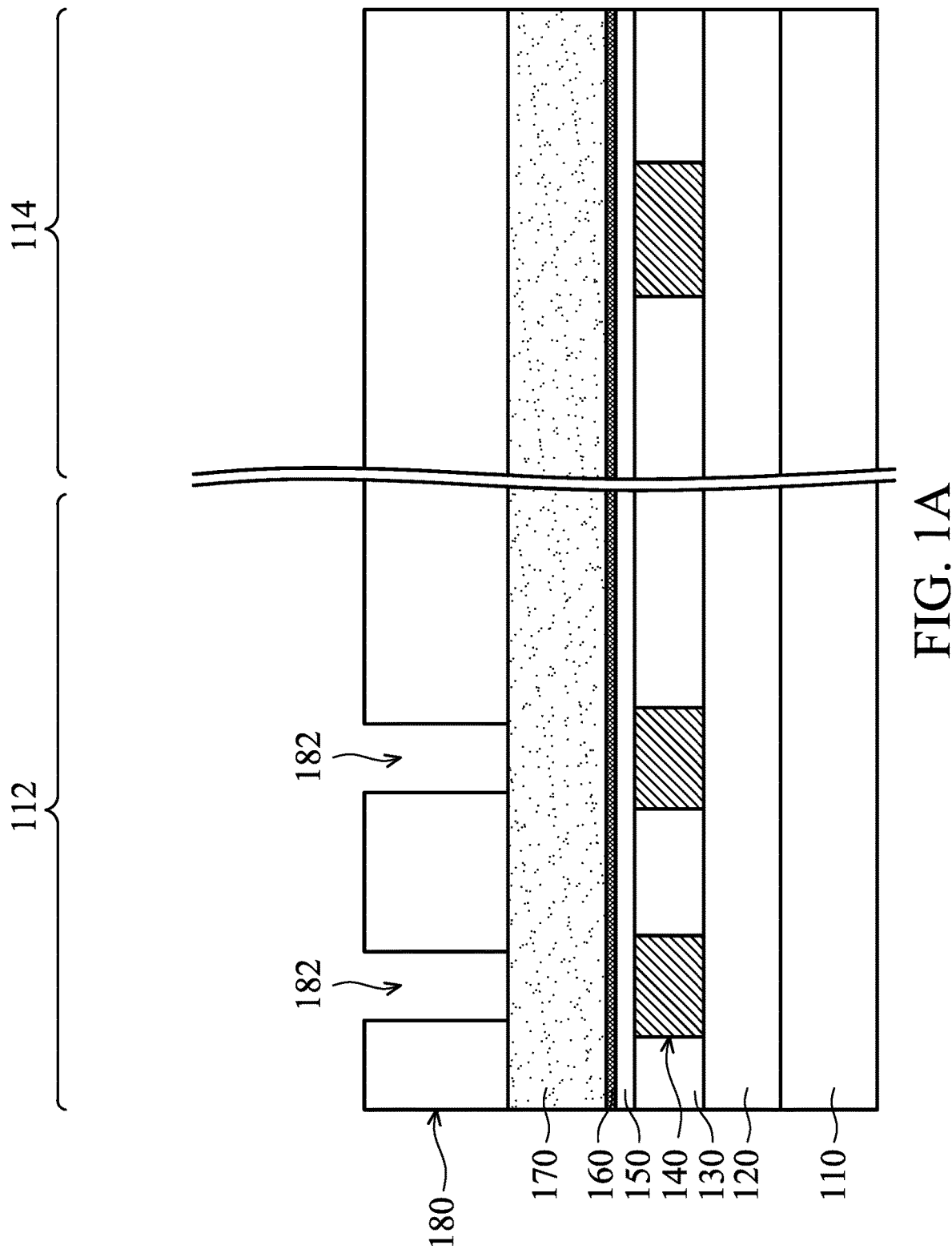
FIGS. 1A-1Q are cross-sectional views of various stages of a process for forming a memory device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% or higher, such as 95% or higher, especially 99% or higher, including 100%, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10%, though the present invention is not limited thereto. The term "about" in relation to a numerical value x may mean x±5 or 10%, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the memory device structure. Some of the features described below can be replaced or eliminated for different embodiments. Although some embodiments are discussed with operations performed in a particular order, these operations may be performed in another logical order.

Figure 1B:
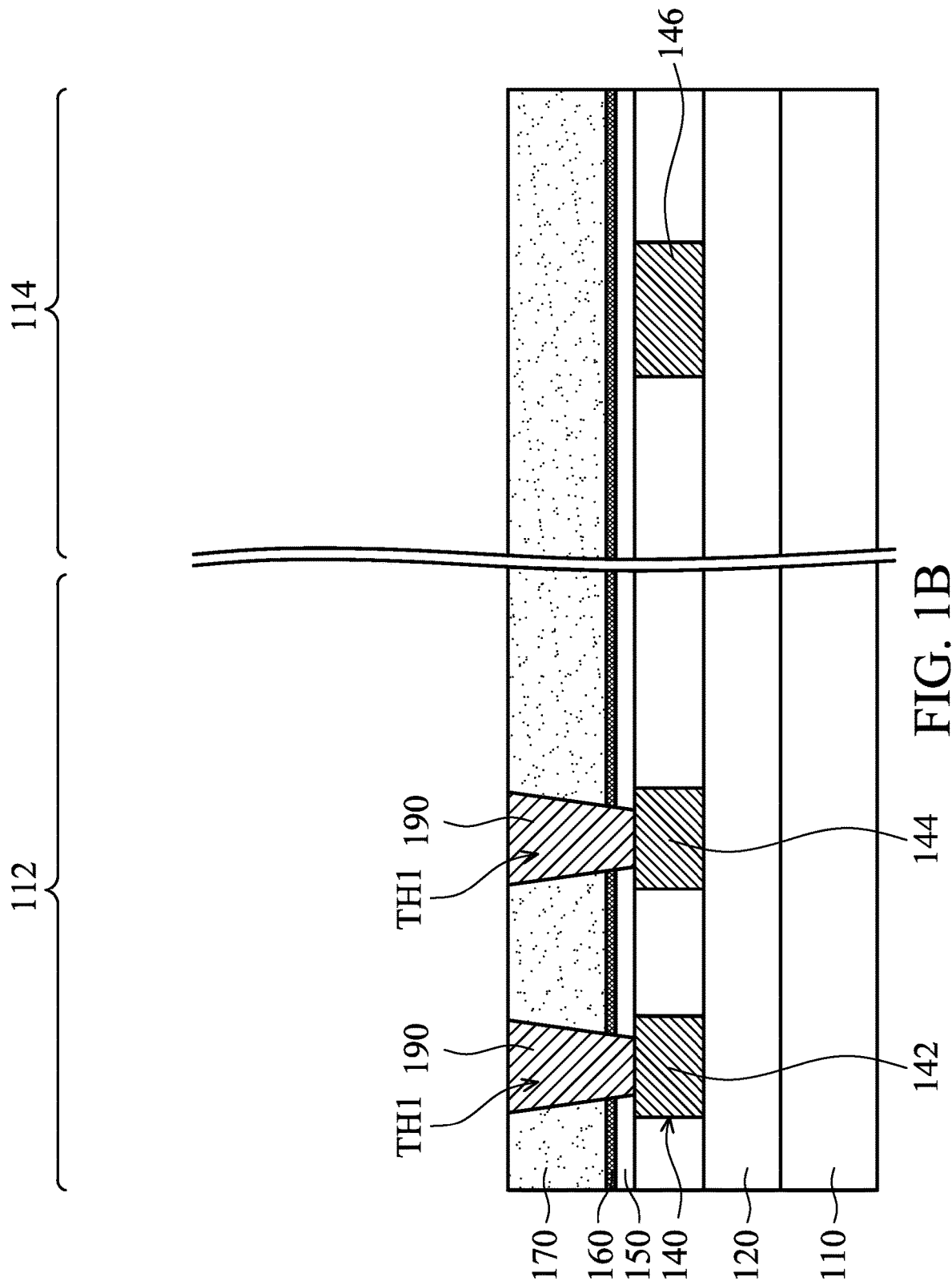
Figure 1C:
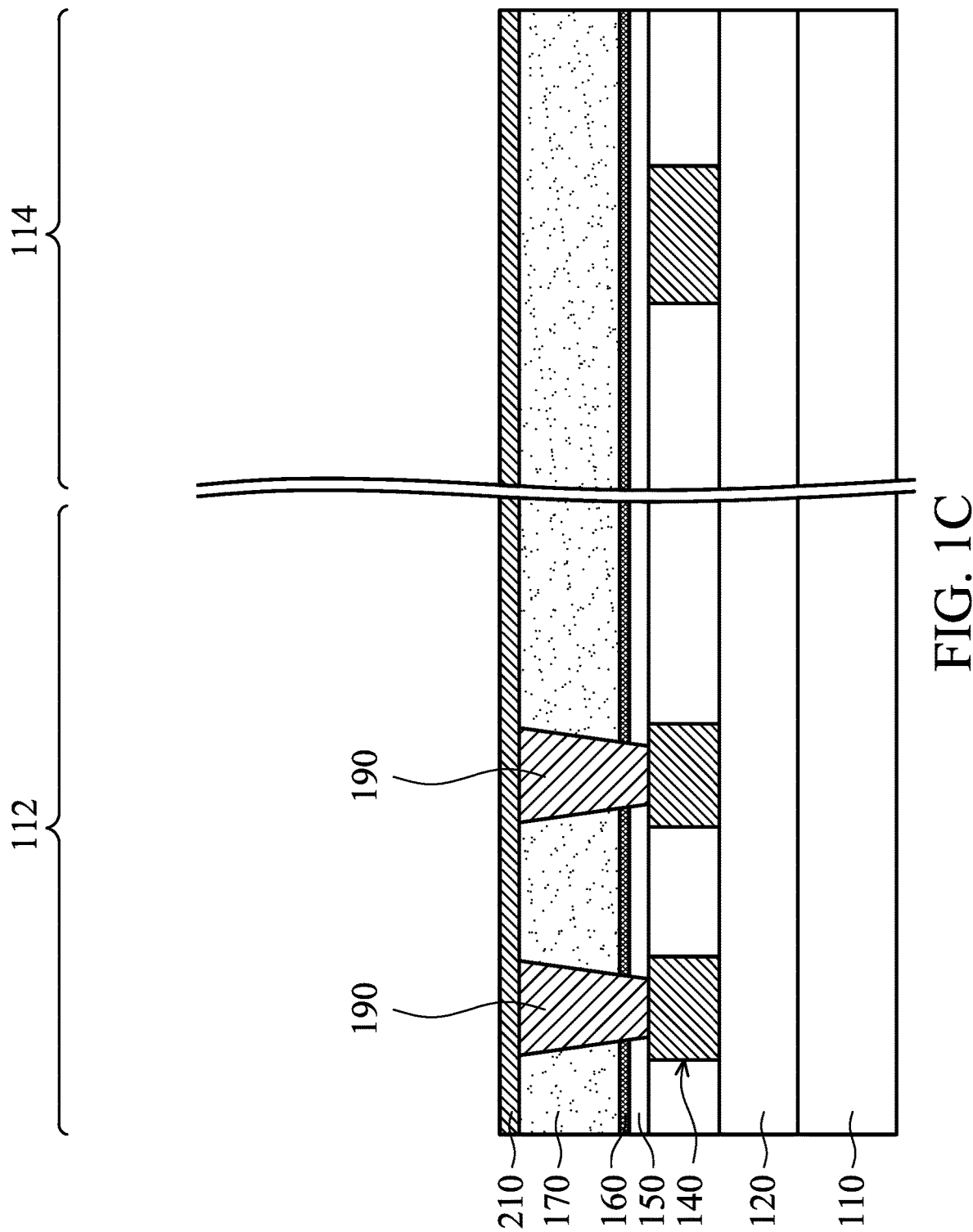
Figure 1D:
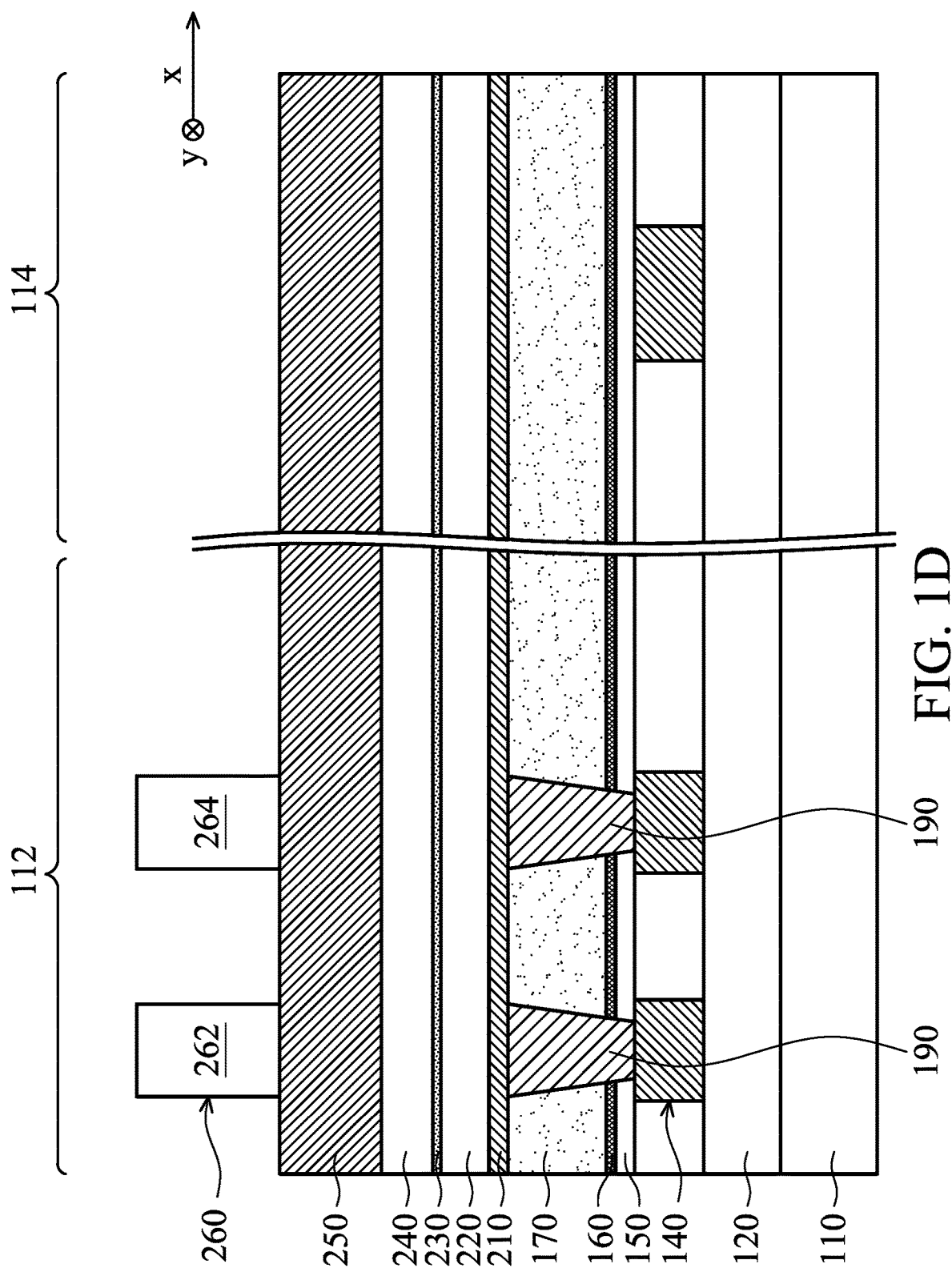
Figure 1E:
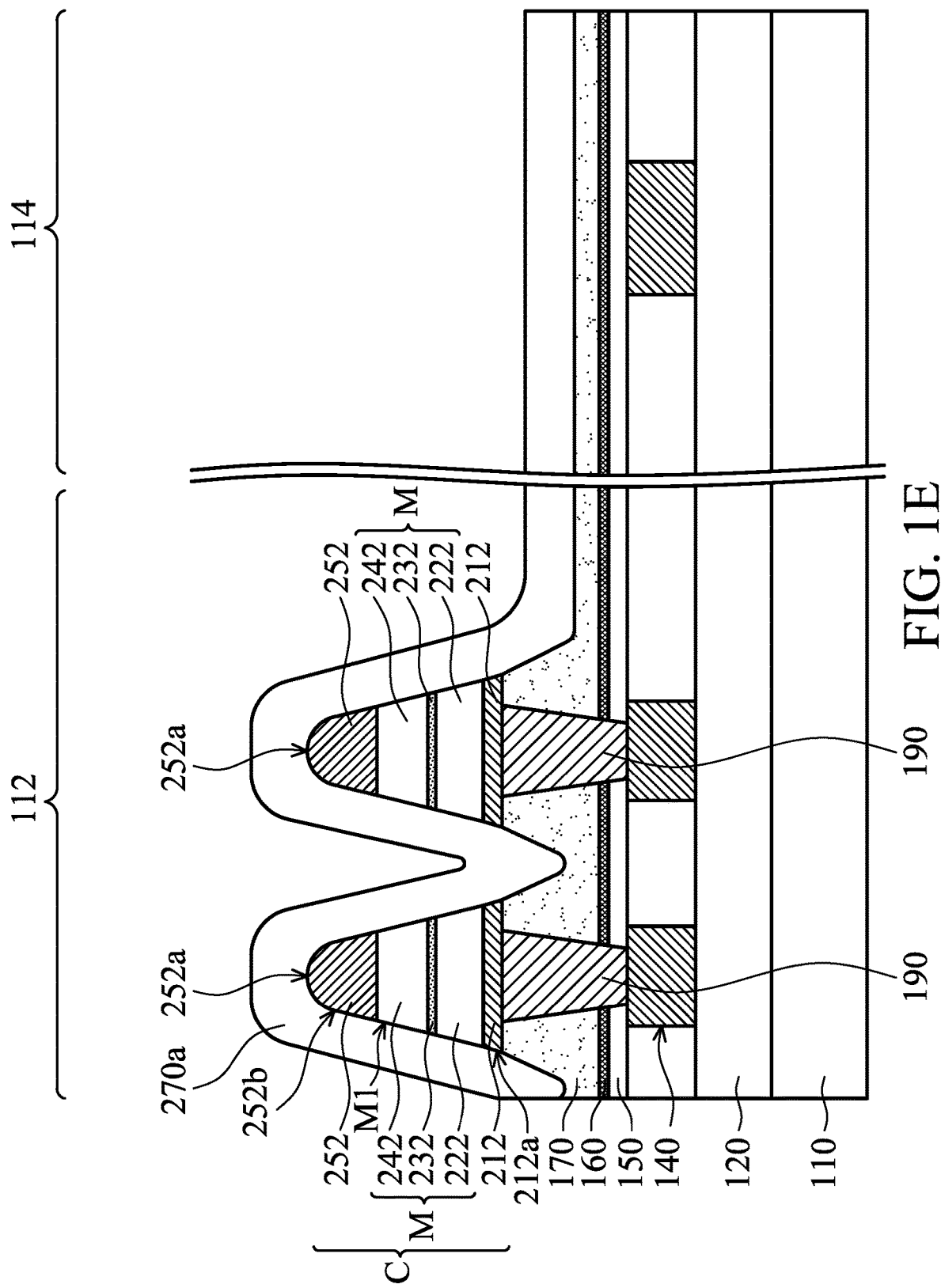
Figure 1G:
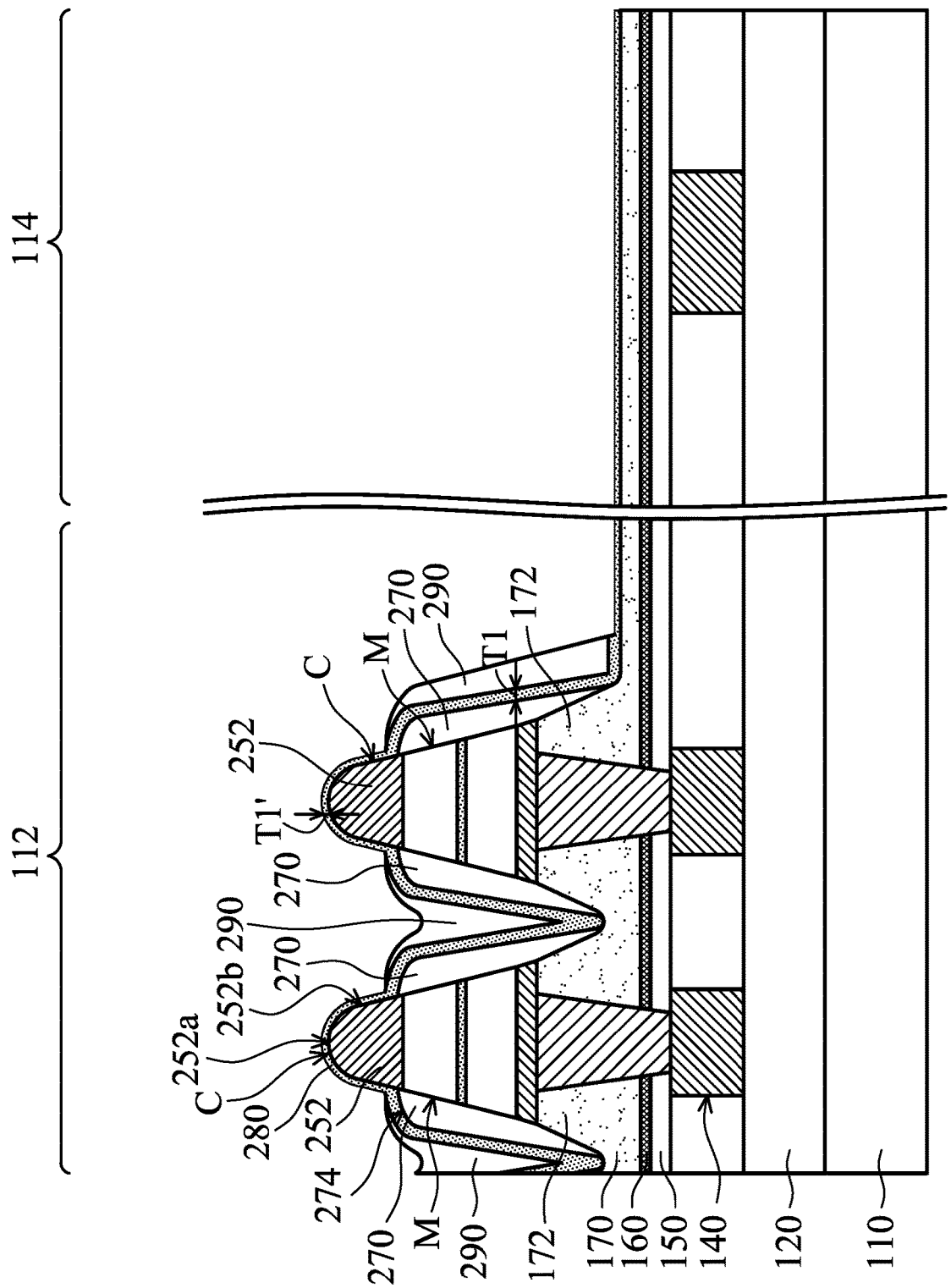
Figure 1H:
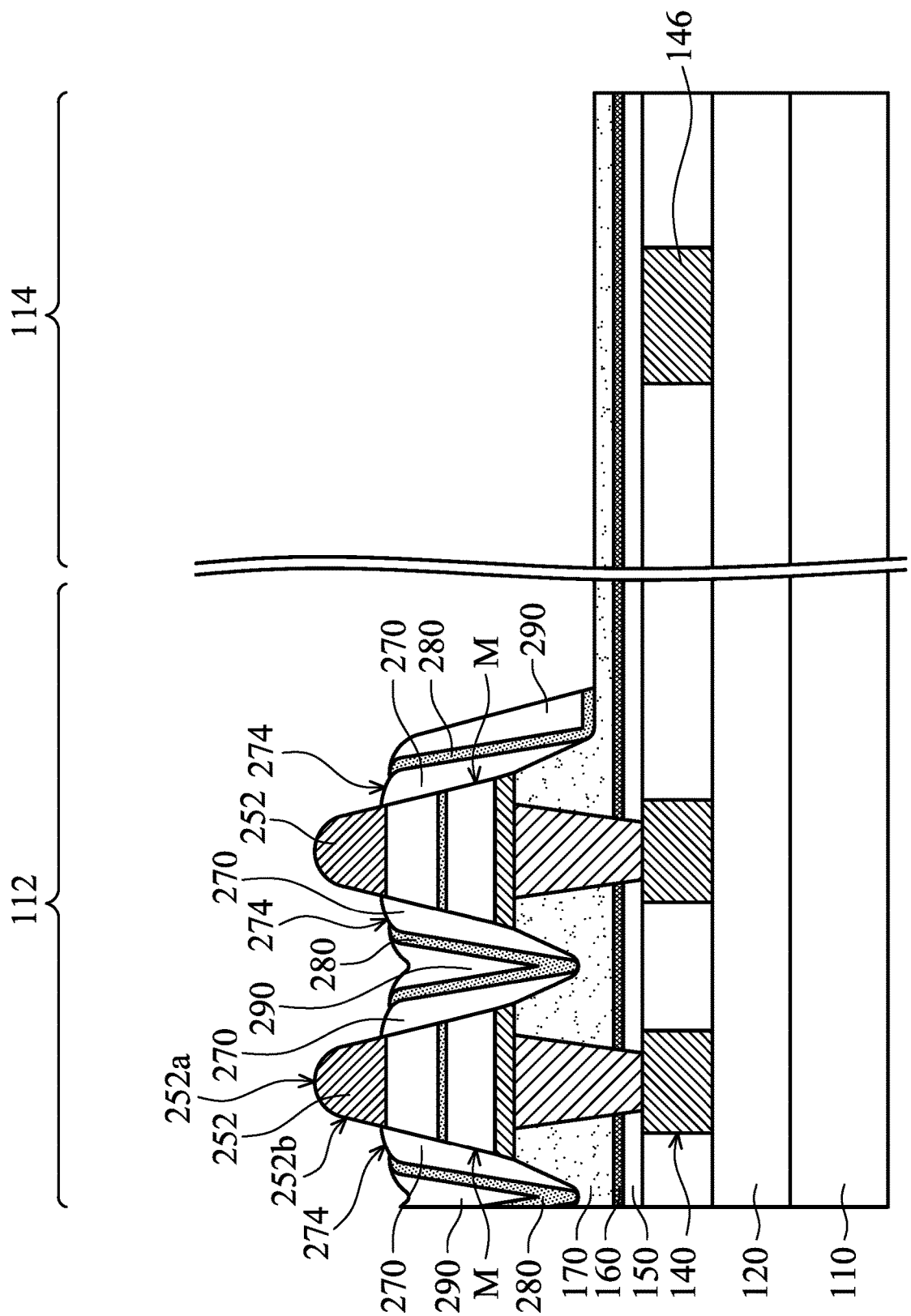
Figure 1I:
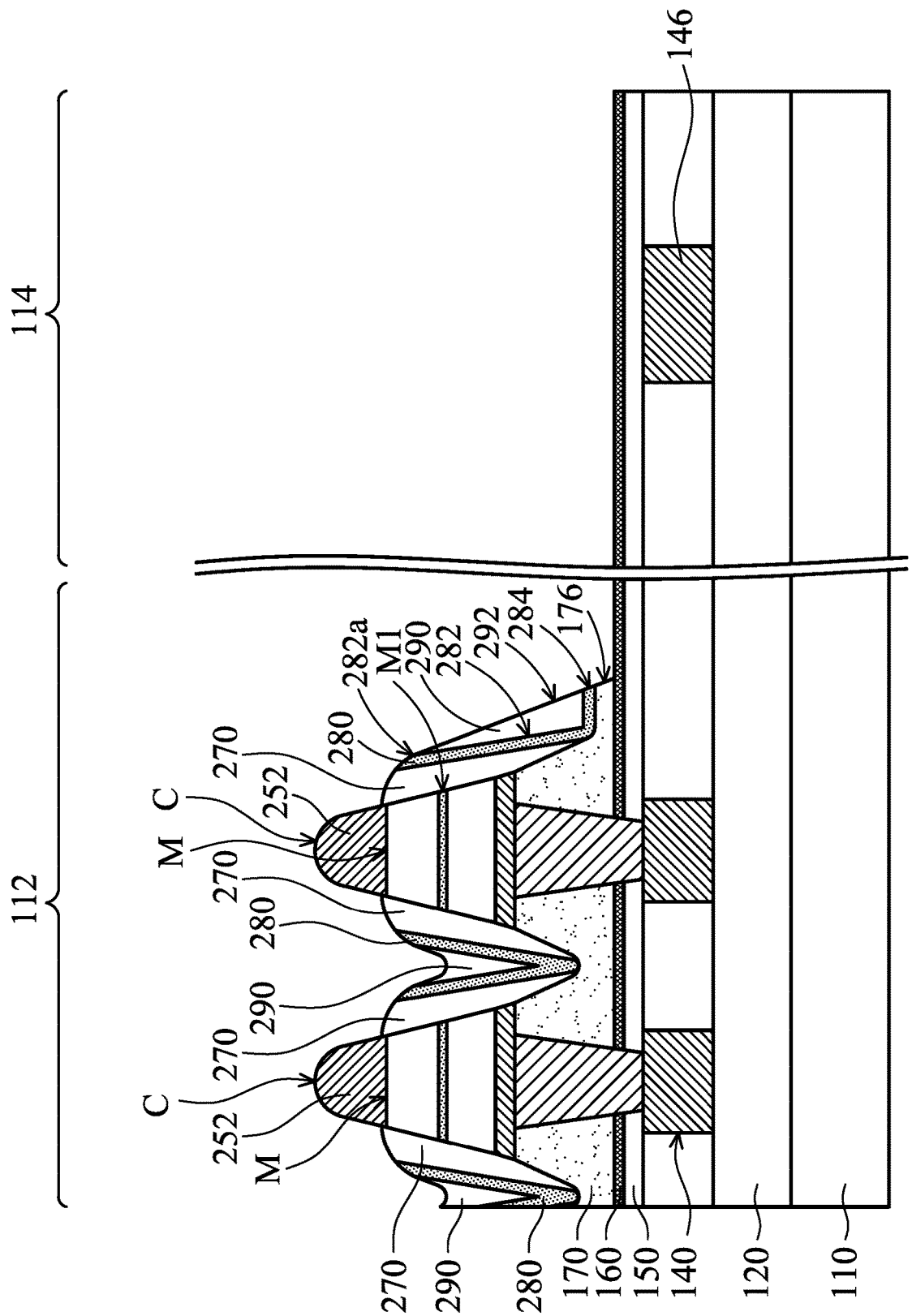
Figure 1J:
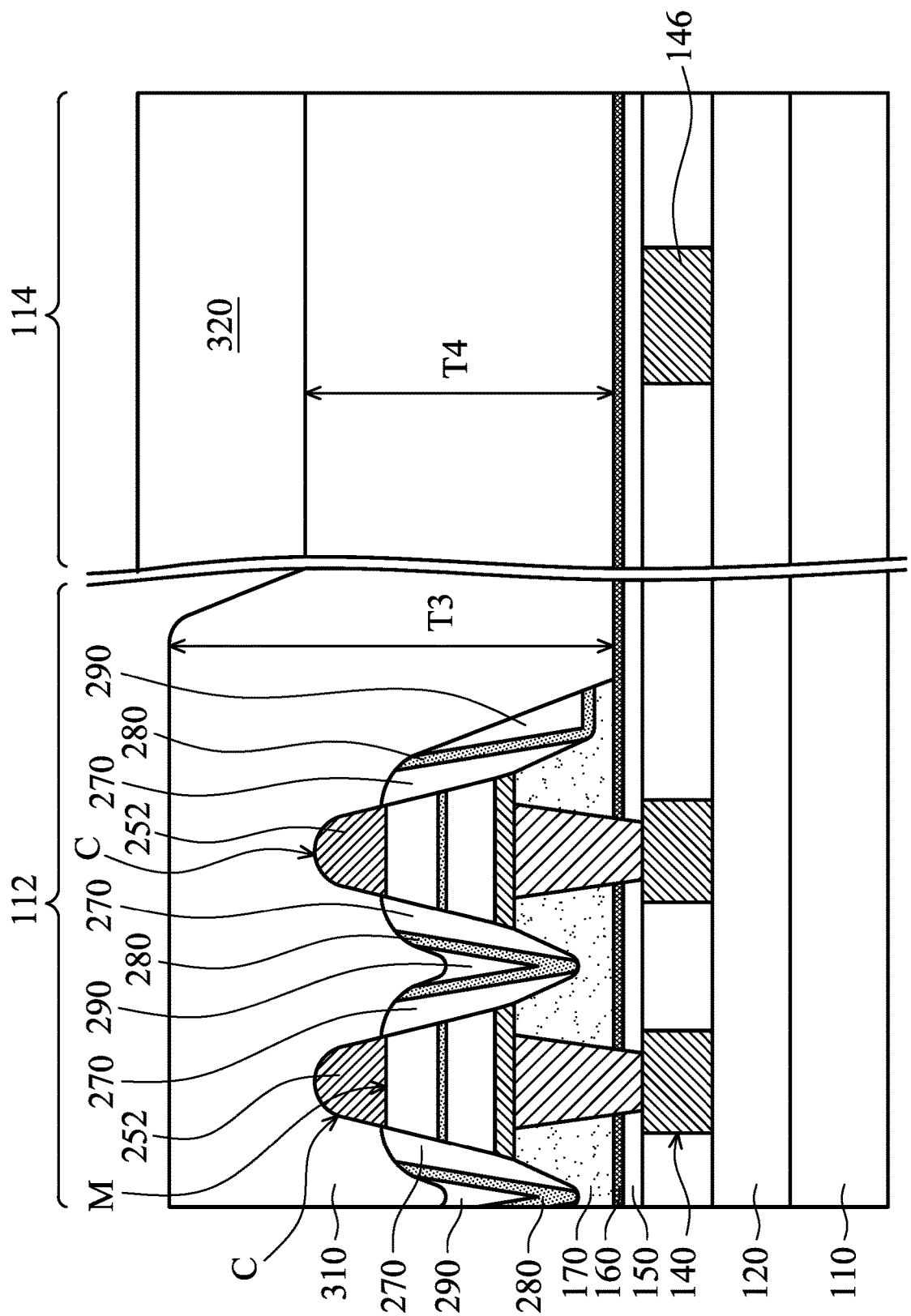
Figure 1K:
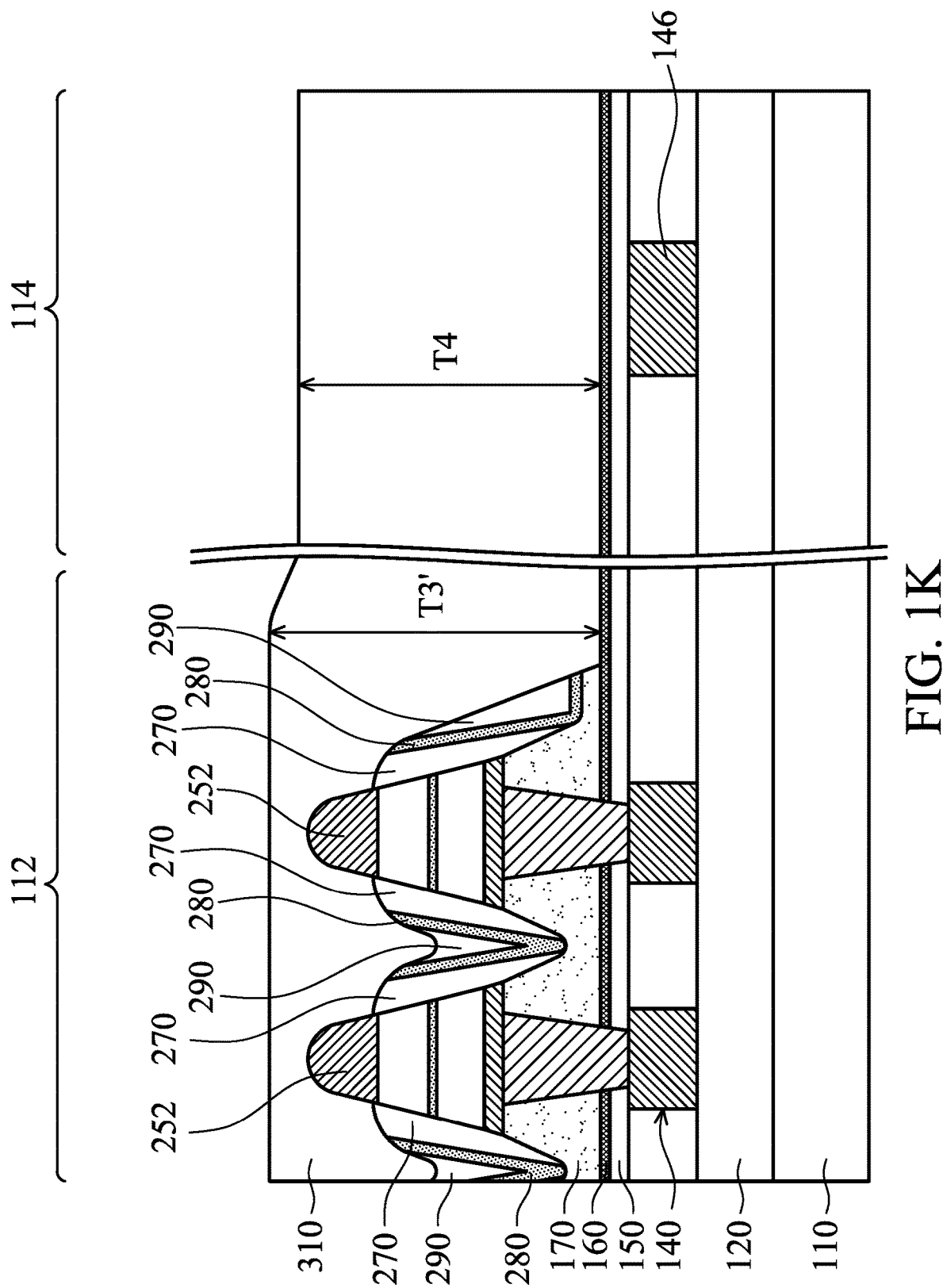
Figure 1L:
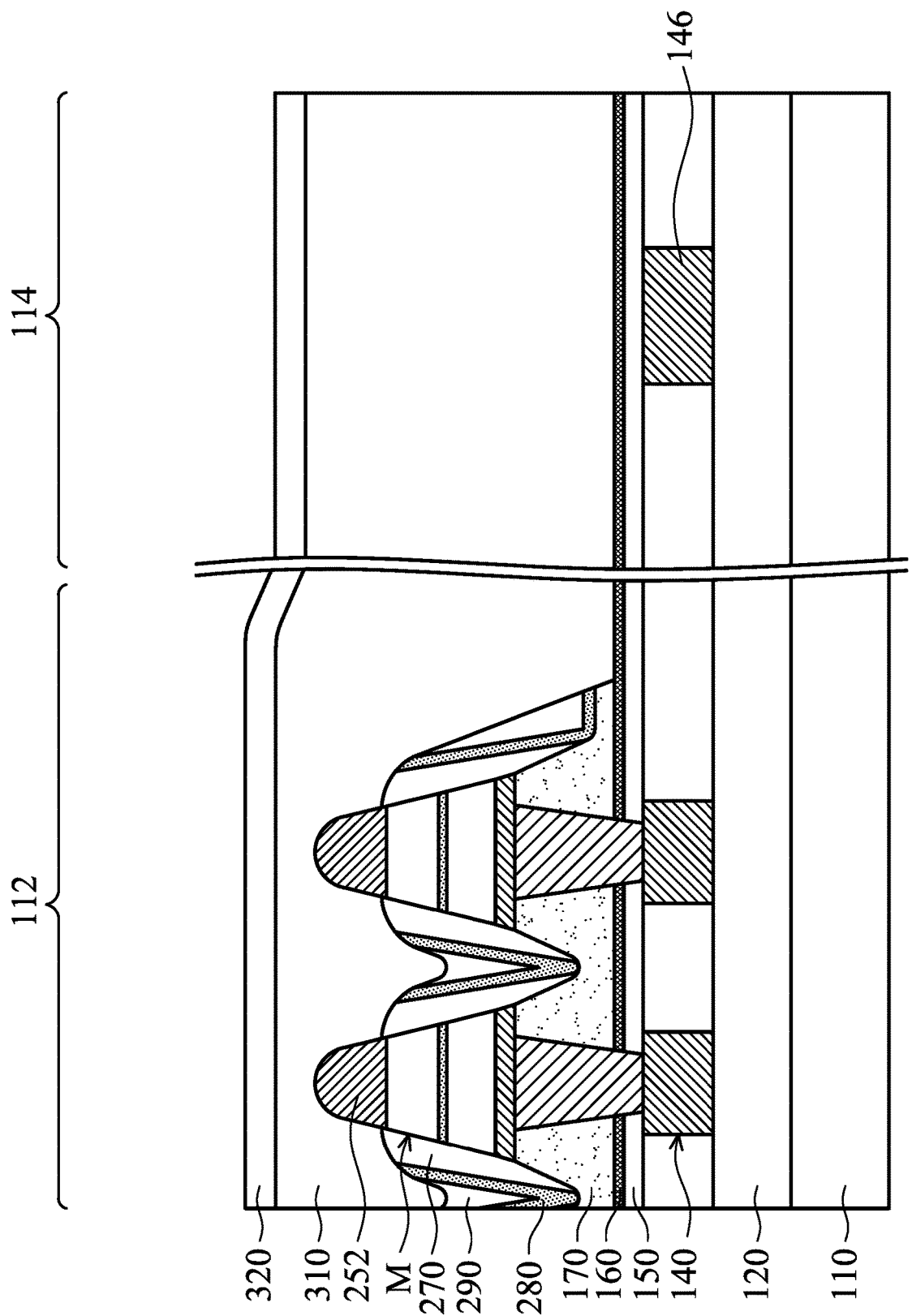
Figure 1M:
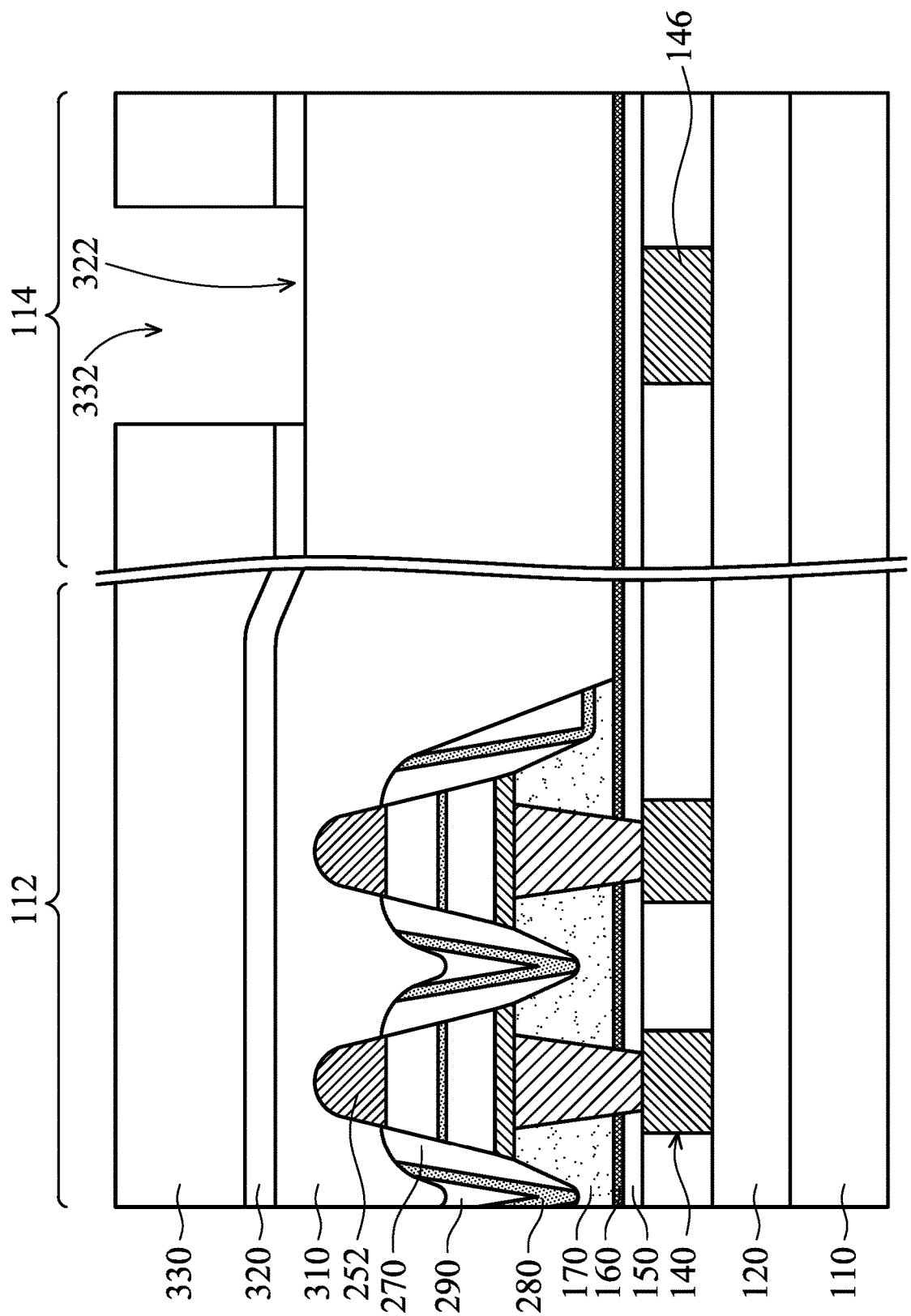
Figure 1N:
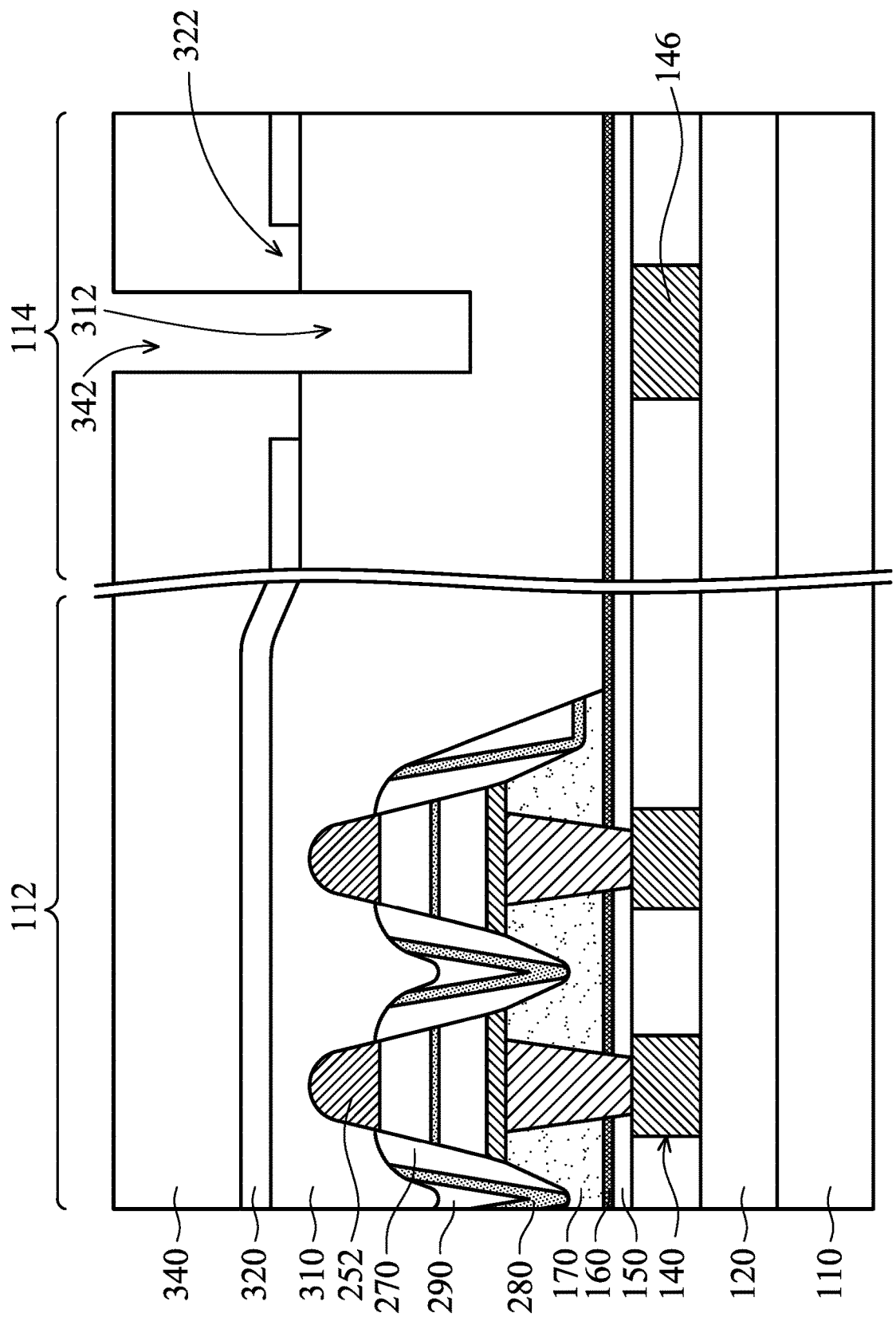
Figure 10:
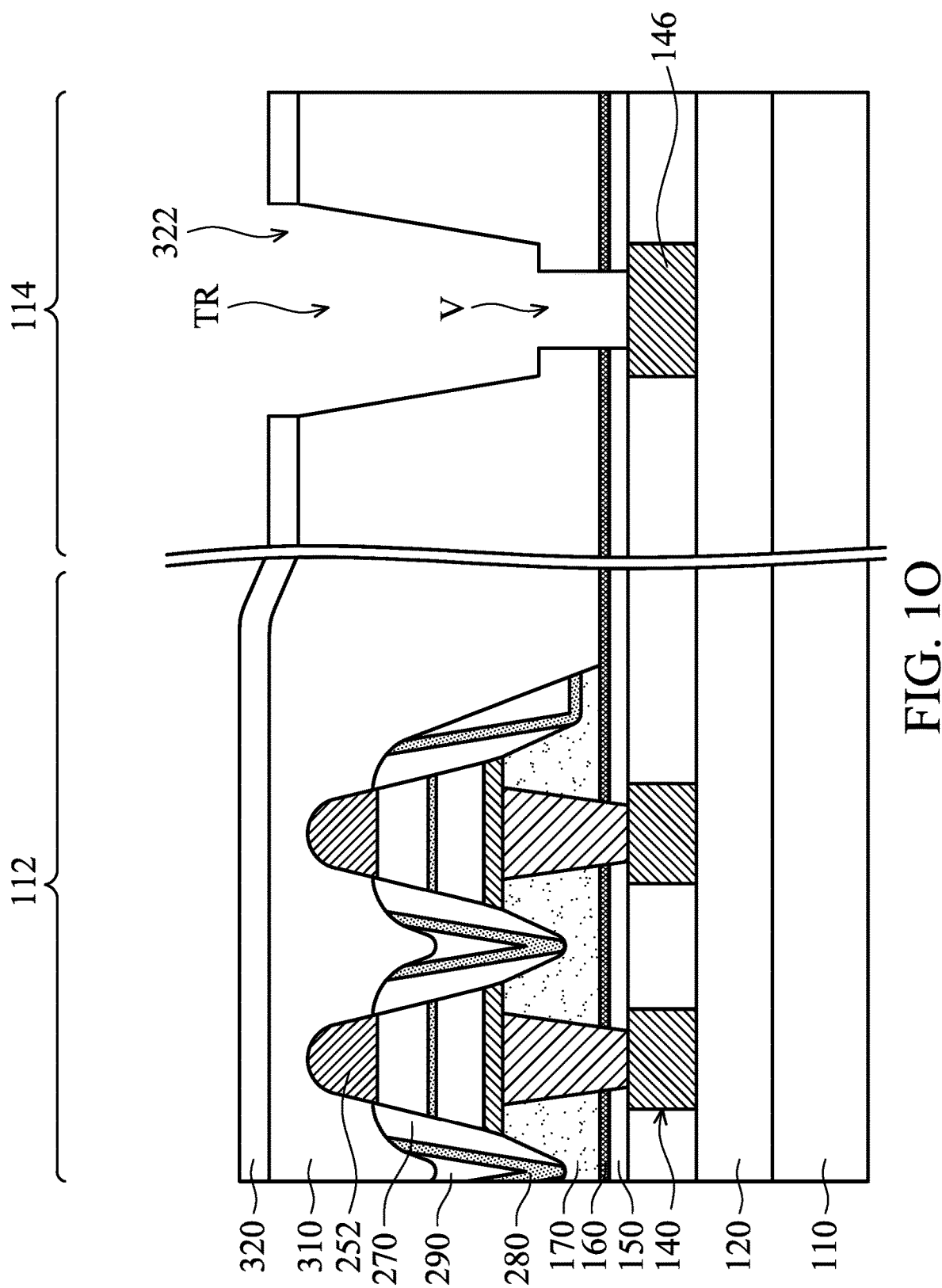
Figure 1P:
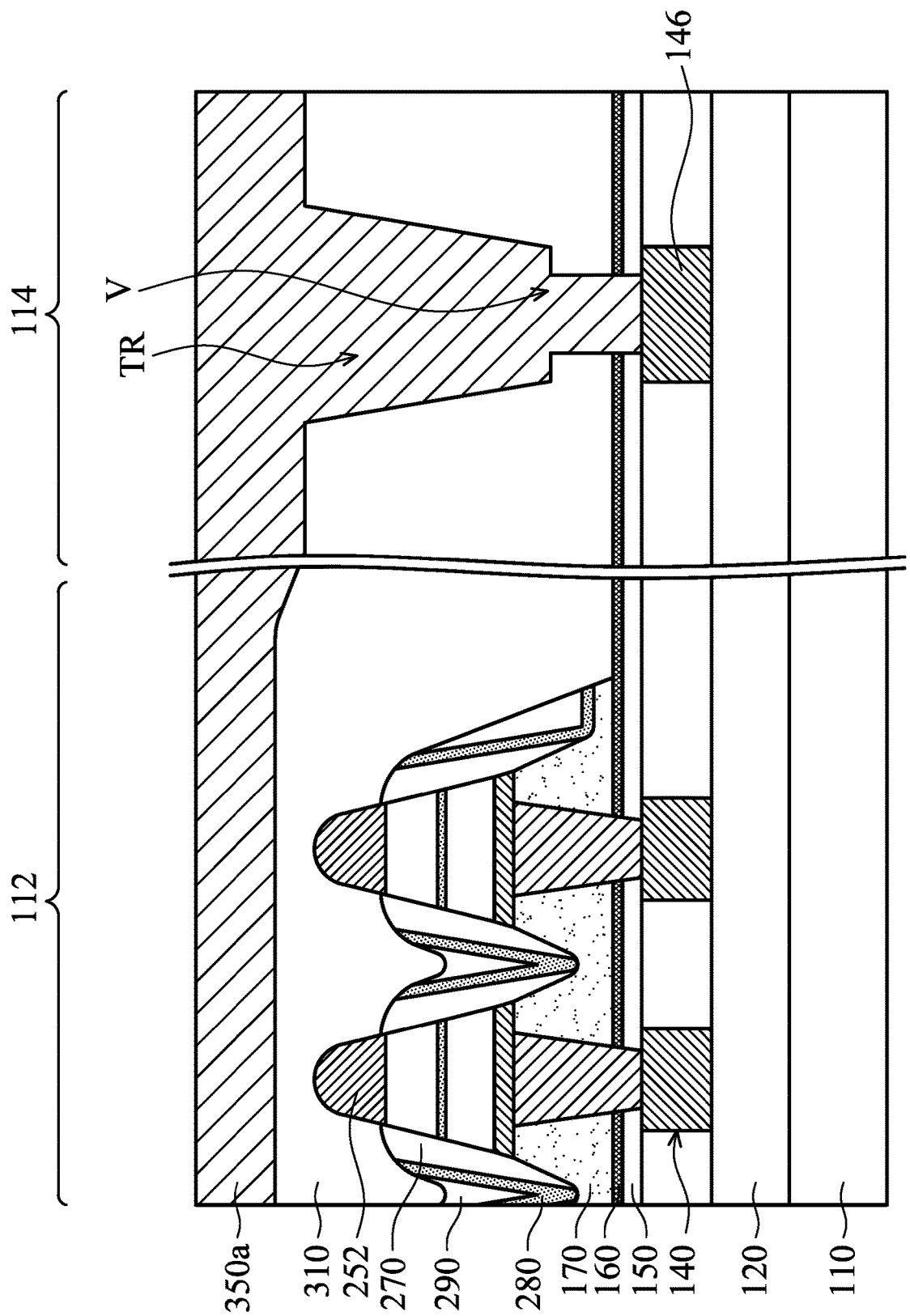
Figure 1Q:
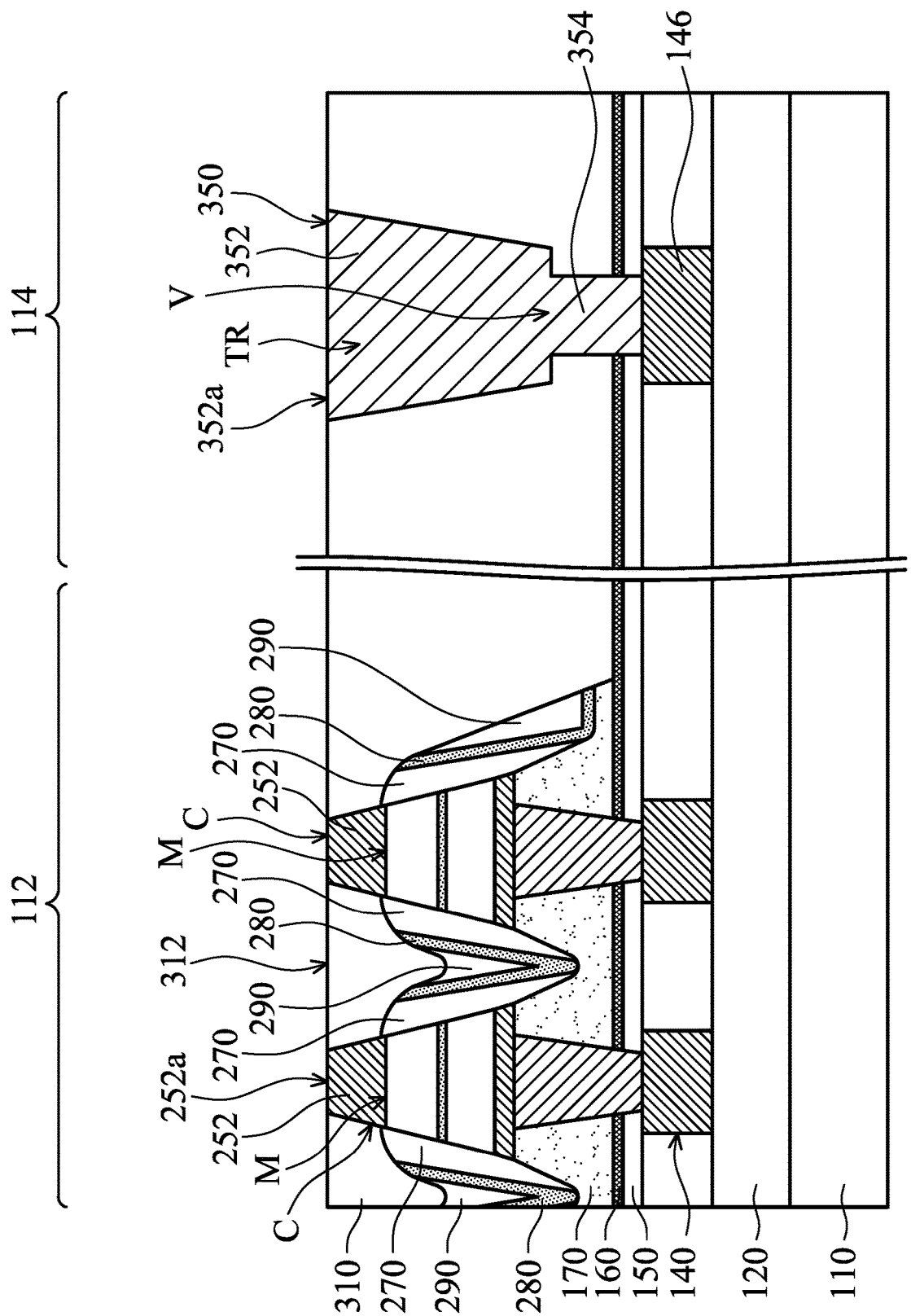

FIGS. 1A-1Q are cross-sectional views of various stages of a process for forming a memory device structure, in accordance with some embodiments. As shown in FIG. 1A, a substrate 110 is provided, in accordance with some embodiments. The substrate 110 has a cell region 112 and a logic region 114, in accordance with some embodiments.

The cell region 112 is used to accommodate magnetic tunnel junction (MTJ) cells, in accordance with some embodiments. The magnetic tunnel junction cells may be used as magnetic random access memory (MRAM) cells, in accordance with some embodiments. The logic region 114 is used to accommodate logic devices, in accordance with some embodiments.

The logic devices include, for example, transistors or some other type of semiconductor devices. In some embodiments, the logic devices support operation of the magnetic random access memory cells. For example, the logic devices facilitate reading data of the magnetic random access memory cells and/or writing data to the magnetic random access memory cells.

The substrate 110 includes, for example, a semiconductor substrate. The substrate 110 includes, for example, a semiconductor wafer (such as a silicon wafer) or a portion of a semiconductor wafer. In some embodiments, the substrate 110 is made of an elementary semiconductor material including silicon or germanium in a single crystal structure, a polycrystal structure, or an amorphous structure.

In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in FIGS for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIG. 1A, a dielectric layer 120 is formed over the substrate 110, in accordance with some embodiments. The dielectric layer 120 is made of an oxide-containing material (e.g., silicon oxide or tetraethyl orthosilicate oxide), an oxynitride-containing material (e.g., silicon oxynitride), a glass material (e.g., borosilicate glass, phosphoric silicate glass, boron phospho-silicate glass, or fluorinated silicate glass), or a combination thereof, in accordance with some embodiments. Alternatively, the dielectric layer 120 includes a low-k material or a porous dielectric material having a k-value which is lower than that of silicon oxide, or lower than about 3.0 or about 2.5, in accordance with some embodiments.

The dielectric layer 120 is formed using a chemical vapor deposition (CVD) process, such as a low-pressure CVD process, a plasma-enhanced CVD process, or a high-density plasma CVD process, an atomic layer deposition process, a spin-on process, a physical vapor deposition process, or another suitable process, in accordance with some embodiments.

In some embodiments, wiring layers (not shown) and conductive vias (not shown) are formed in the dielectric layer 120. The conductive vias are electrically connected between the wiring layers and between the wiring layers and the device elements (e.g., transistors) formed in and/or over the substrate 110, in accordance with some embodiments. The wiring layers and the conductive vias are made of a conductive material, such as metal (e.g., copper, aluminum, gold, silver, or tungsten) or alloys thereof, in accordance with some embodiments.

As shown in FIG. 1A, a dielectric layer 130 is formed over the dielectric layer 120, in accordance with some embodiments. The dielectric layer 130 is made of an oxide-containing material (e.g., silicon oxide or tetraethyl orthosilicate oxide), an oxynitride-containing material (e.g., silicon oxynitride), a glass material (e.g., borosilicate glass, phosphoric silicate glass, boron phospho-silicate glass, or fluorinated silicate glass), or a combination thereof, in accordance with some embodiments. Alternatively, the dielectric layer 130 includes a low-k material or a porous dielectric material having a k-value which is lower than that of silicon oxide, or lower than about 3.0 or about 2.5, in accordance with some embodiments.

The dielectric layer 130 is formed using a chemical vapor deposition (CVD) process, such as a low-pressure CVD process, a plasma-enhanced CVD process, or a high-density plasma CVD process, an atomic layer deposition process, a spin-on process, a physical vapor deposition process, or another suitable process, in accordance with some embodiments.

As shown in FIG. 1A, a wiring layer 140 is formed in the dielectric layer 130, in accordance with some embodiments. The conductive vias in the dielectric layer 120 are electrically connected between the wiring layer 140 and another wiring layer in the dielectric layer 120, in accordance with some embodiments. The wiring layer 140 is electrically connected to the device elements (e.g. transistors) formed in and/or over the substrate 110 through the conductive vias and the wiring layers in the dielectric layer 120, in accordance with some embodiments. The wiring layer 140 is made of a conductive material, such as metal (e.g., copper, aluminum, gold, silver, or tungsten) or alloys thereof, in accordance with some embodiments.

As shown in FIG. 1A, an etch stop layer 150 is formed over the wiring layer 140 and the dielectric layer 130, in accordance with some embodiments. The etch stop layer 150 is thinner than the wiring layer 140 or the dielectric layer 130, in accordance with some embodiments.

The etch stop layer 150 is made of a nitride-containing material, such as silicon carbonitride (SiCN) or silicon nitride, or another suitable material, which is different from that of the dielectric layer 130 and the wiring layer 140, in accordance with some embodiments. The etch stop layer 150 is formed using a chemical vapor deposition process, an atomic layer deposition process, a physical vapor deposition process, or another suitable process.

As shown in FIG. 1A, an etch stop layer 160 is formed over the etch stop layer 150, in accordance with some embodiments. The etch stop layer 160 is thinner than the wiring layer 140 or the dielectric layer 130, in accordance with some embodiments. The etch stop layer 160 is made of a oxide-containing material, such as aluminum oxide, or another suitable material, which is different from that of the etch stop layer 150, the dielectric layer 130, and the wiring layer 140, in accordance with some embodiments. The etch stop layer 160 is formed using a chemical vapor deposition process, an atomic layer deposition process, a physical vapor deposition process, or another suitable process.

As shown in FIG. 1A, a dielectric layer 170 is formed over the etch stop layer 160, in accordance with some embodiments. The dielectric layer 170 is thicker than the etch stop layer 160, in accordance with some embodiments.

The dielectric layer 170 and the etch stop layer 160 are made of different materials, in accordance with some embodiments.

The dielectric layer 170 is made of a low-k material or a porous dielectric material having a k-value which is lower than that of silicon oxide, or lower than about 3.0 or about 2.5, in accordance with some embodiments. The low-k material includes a fluorinated material, such as amorphous fluorinated carbon (α-C:F), poly-tetra-fluoro-ethylene (PTFE), fluorinated polyimide, phosphor-silicate glass, in accordance with some embodiments.

Alternatively, the dielectric layer 170 includes an oxide-containing material (e.g., silicon oxide or tetraethyl orthosilicate oxide), an oxynitride-containing material (e.g., silicon oxynitride), a glass material (e.g., borosilicate glass, phosphoric silicate glass, boron phospho-silicate glass, or fluorinated silicate glass), a combination thereof, or another suitable dielectric material, in accordance with some embodiments.

The dielectric layer 170 is formed using a chemical vapor deposition (CVD) process, such as a low-pressure CVD process, a plasma-enhanced CVD process, or a high-density plasma CVD process, an atomic layer deposition process, a spin-on process, a physical vapor deposition process, or another suitable process, in accordance with some embodiments.

As shown in FIG. 1A, a mask layer 180 is formed over the dielectric layer 170, in accordance with some embodiments. The mask layer 180 has openings 182, in accordance with some embodiments. The openings 182 expose portions of the dielectric layer 170 over the wiring layer 140, in accordance with some embodiments. The mask layer 180 is made of a polymer material, such as a photoresist material, or another suitable material, in accordance with some embodiments.

As shown in FIGS. 1A and 1B, the portions of the dielectric layer 170 exposed by the openings 182 are removed through the openings 182, in accordance with some embodiments. The removal process includes an etching process, such as an anisotropic etching process (e.g., a dry etching process), in accordance with some embodiments.

As shown in FIGS. 1A and 1B, portions of the etch stop layer 160 under the openings 182 are removed through the openings 182, in accordance with some embodiments. The removal process includes an etching process, such as an anisotropic etching process (e.g., a dry etching process), in accordance with some embodiments.

As shown in FIGS. 1A and 1B, portions of the etch stop layer 150 under the openings 182 are removed through the openings 182, in accordance with some embodiments. After the removal processes for removing the portions of the dielectric layer 170 and the etch stop layer 150 and 160 under the openings 182, through holes TH1 are formed in the dielectric layer 170 and the etch stop layer 150 and 160, in accordance with some embodiments.

The wiring layer 140 includes conductive lines 142, 144 and 146, in accordance with some embodiments. The through holes TH1 respectively expose the conductive lines 142 and 144, in accordance with some embodiments. The removal process includes an etching process, such as an anisotropic etching process (e.g., a dry etching process), in accordance with some embodiments.

As shown in FIG. 1B, conductive vias 190 are formed in the through holes TH1 respectively, in accordance with some embodiments. The conductive vias 190 pass through the dielectric layer 170 and the etch stop layer 150 and 160, in accordance with some embodiments. The conductive vias 190 are electrically connected to the conductive lines 142 and 144 thereunder, in accordance with some embodiments.

The conductive vias 190 are made of a conductive material, such as metal (e.g., copper, aluminum, gold, silver, or tungsten) or alloys thereof, in accordance with some embodiments. The conductive vias 190 are formed using a deposition process (e.g., a physical vapor deposition process) and a planarization process (e.g., a chemical mechanical polishing process), in accordance with some embodiments.

As shown in FIG. 1C, a bottom electrode layer 210 is formed over the conductive vias 190 and the dielectric layer 170, in accordance with some embodiments. The bottom electrode layer 210 conformally covers the conductive vias 190 and the dielectric layer 170, in accordance with some embodiments.

The bottom electrode layer 210 is made of a conductive material, such as a nitride material (e.g., titanium nitride or tantalum nitride), metal (e.g., tantalum, copper, aluminum, gold, silver, or tungsten), or alloys thereof, in accordance with some embodiments. The bottom electrode layer 210 is formed using a deposition process, such as a high-density ionized metal plasma (IMP) deposition process, a high-density inductively coupled plasma (ICP) deposition process, a sputtering process, a physical vapor deposition process, or a chemical vapor deposition process, in accordance with some embodiments.

As shown in FIG. 1D, a ferromagnetic material layer 220 is formed over the bottom electrode layer 210, in accordance with some embodiments. As shown in FIG. 1D, a tunnel barrier material layer 230 is formed over the ferromagnetic material layer 220, in accordance with some embodiments. As shown in FIG. 1D, a ferromagnetic material layer 240 is formed over the tunnel barrier material layer 230, in accordance with some embodiments. As shown in FIG. 1D, a top electrode layer 250 is formed over the ferromagnetic material layer 240, in accordance with some embodiments.

In some embodiments, the ferromagnetic material layer 220 is used as a ferromagnetic pinned layer, and the ferromagnetic material layer 240 is used as a ferromagnetic free layer. The ferromagnetic pinned layer has a magnetic moment that is fixed in the x direction, and the ferromagnetic free layer has a magnetic moment that is either parallel or anti-parallel (along the x axis) to the magnetic moment in the ferromagnetic pinned layer, in accordance with some embodiments.

In some embodiments, a current can pass through the tunnel barrier layer 230 by the mechanism of quantum mechanical tunneling. The magnetic moment of the ferromagnetic free layer may change in response to external magnetic fields. The relative orientation of the magnetic moments between the ferromagnetic free and ferromagnetic pinned layers determines the tunneling current and the resistance of the tunneling junction.

When a sense current is passed from the top electrode layer 250 to the bottom electrode layer 210 in a direction perpendicular to the substrate 110, a lower resistance is detected when the magnetization directions of the ferromagnetic free and ferromagnetic pinned layers are in a parallel state ("1" memory state) and a higher resistance is noted when they are in an anti-parallel state ("0" memory state).

The ferromagnetic material layer 220 is made of CoFe, Ru, CoFeB, or another suitable ferromagnetic pinned material, in accordance with some embodiments. The tunnel barrier material layer 230 is made of an oxide material, such as MgO, AlO, AlTiO, or another suitable tunnel barrier material, in accordance with some embodiments. The ferromagnetic material layer 240 is made of CoFeB, CoFe, NiFe, or another suitable ferromagnetic free material, in accordance with some embodiments.

The top electrode layer 250 is made of a conductive material, such as a nitride material (e.g., titanium nitride or tantalum nitride), metal (e.g., tantalum, copper, aluminum, gold, silver, or tungsten), or alloys thereof, in accordance with some embodiments. The top electrode layer 250 is formed using a deposition process, such as a high-density ionized metal plasma (IMP) deposition process, a high-density inductively coupled plasma (ICP) deposition process, a sputtering process, a physical vapor deposition process, or a chemical vapor deposition process, in accordance with some embodiments.

As shown in FIG. 1D, a mask layer 260 is formed over the top electrode layer 250, in accordance with some embodiments. The mask layer 260 has portions 262 and 264, in accordance with some embodiments. The portions 262 and 264 are respectively over the conductive vias 190, in accordance with some embodiments. The mask layer 260 is made of a polymer material, such as a photoresist material, or another suitable material, in accordance with some embodiments.

As shown in FIG. 1E, portions of the top electrode layer 250, the ferromagnetic material layer 240, the tunnel barrier material layer 230, the ferromagnetic material layer 220, the bottom electrode layer 210, and the dielectric layer 170, which are not covered by the mask layer 260, are removed, in accordance with some embodiments. The mask layer 260 is consumed up during the removal process, in accordance with some embodiments.

After the removal process, the remaining bottom electrode layer 210 forms bottom electrodes 212 respectively over the conductive vias 190, in accordance with some embodiments. The remaining ferromagnetic material layer 220 forms ferromagnetic layers 222 respectively over the bottom electrodes 212, in accordance with some embodiments.

The remaining tunnel barrier material layer 230 forms tunnel barrier layers 232 respectively over the ferromagnetic layers 222, in accordance with some embodiments. The remaining ferromagnetic material layer 240 forms ferromagnetic layers 242 respectively over the tunnel barrier layers 232, in accordance with some embodiments.

The remaining top electrode layer 250 forms top electrodes 252 respectively over the ferromagnetic layers 242, in accordance with some embodiments. The top electrode 252 has a top surface 252*a* and a sidewall 252*b*, in accordance with some embodiments. The top surface 252*a* is a curved surface, in accordance with some embodiments.

The ferromagnetic layer 222, the tunnel barrier layer 232 thereover, and the ferromagnetic layer 242 thereover together form a magnetic tunnel junction stack M, in accordance with some embodiments. The bottom electrode 212, the magnetic tunnel junction stack M thereover, and the top electrode 252 thereover together form a magnetic tunnel junction cell C, in accordance with some embodiments.

In the magnetic tunnel junction cell C, a sidewall M1 of the magnetic tunnel junction stack M, a sidewall 212*a* of the bottom electrode 212, and the sidewall 252*b* of the top electrode 252 are substantially coplanar, in accordance with some embodiments. The magnetic tunnel junction cell C is electrically connected to the conductive via 190 thereunder, in accordance with some embodiments.

As shown in FIG. 1E, a spacer material layer 270*a* is formed over the magnetic tunnel junction cells C and the dielectric layer 170, in accordance with some embodiments.

The spacer material layer 270*a* is made of a nitride material (e.g., silicon nitride), an oxynitride-containing material (e.g., silicon oxynitride), or a combination thereof, in accordance with some embodiments.

The spacer material layer 270*a* is formed using a chemical vapor deposition (CVD) process, such as a low-pressure CVD process, a plasma-enhanced CVD process, or a high-density plasma CVD process, an atomic layer deposition process, a physical vapor deposition process, or another suitable process, in accordance with some embodiments.

As shown in FIGS. 1E and 1F, portions of the spacer material layer 270*a* are removed, in accordance with some embodiments. The remaining spacer material layer 270*a* forms spacer layers 270, in accordance with some embodiments. Each spacer layer 270 surrounds the corresponding magnetic tunnel junction cell C and an upper portion 172 of the dielectric layer 170, in accordance with some embodiments. The removal process includes an etching process, such as an anisotropic etching process (e.g., a dry etching process), in accordance with some embodiments.

As shown in FIG. 1F, an etch stop layer 280 is formed over the spacer layers 270, the magnetic tunnel junction cells C, and the dielectric layer 170, in accordance with some embodiments. The etch stop layer 280 is thicker than the etch stop layer 160, in accordance with some embodiments. That is, the thickness T1 of the etch stop layer 280 is greater than the thickness T2 of the etch stop layer 160, in accordance with some embodiments.

The thickness T1 is greater than about 30 Å, in accordance with some embodiments. The thickness T1 ranges from about 31 Å to about 120 Å, in accordance with some embodiments. If the thickness T1 is less than 30 Å, the etch stop layer 280 may be unable to protect the magnetic tunnel junction cells C in a subsequent etching process for defining the dielectric layer 170, in accordance with some embodiments. If the thickness T1 is greater than about 120 Å, the time for the etching process for defining the etch stop layer 280 may be too long, in accordance with some embodiments.

The etch stop layer 280 conformally covers the dielectric layer 170, sidewalls 272 and top surfaces 274 of the spacer layers 270, and the sidewalls 252*b* and the top surfaces 252*a* of the top electrodes 252, in accordance with some embodiments. The spacer layer 270 is between the corresponding magnetic tunnel junction cell C and the etch stop layer 280 and between the corresponding upper portion 172 of the dielectric layer 170 and the etch stop layer 280, in accordance with some embodiments.

The etch stop layer 280 is made of a oxide-containing material, such as aluminum oxide, or another suitable material, which is different from that of the spacer layers 270, the magnetic tunnel junction cells C, and the dielectric layer 170, in accordance with some embodiments. The etch stop layers 160 and 280 are made of the same material, in accordance with some embodiments. The etch stop layer 280 is formed using a chemical vapor deposition process, an atomic layer deposition process, a physical vapor deposition process, or another suitable process.

As shown in FIG. 1F, a spacer material layer 290*a* is formed over the etch stop layer 280, in accordance with some embodiments. The spacer material layer 290*a* is made of a nitride material (e.g., silicon nitride), an oxynitride-containing material (e.g., silicon oxynitride), or a combination thereof, in accordance with some embodiments.

The spacer material layer 290*a* is formed using an atomic layer deposition process, a chemical vapor deposition (CVD) process, such as a low-pressure CVD process, a plasma-enhanced CVD process, or a high-density plasma CVD process, a physical vapor deposition process, or another suitable process, in accordance with some embodiments.

As shown in FIGS. 1F and 1G, portions of the spacer material layer 290a are removed, in accordance with some embodiments. The etch stop layer 280 over the logic region 114 is exposed, in accordance with some embodiments. The remaining spacer material layer 290a forms a spacer layer 290, in accordance with some embodiments.

The spacer layer 290 surrounds the spacer layers 270, the magnetic tunnel junction cells C and the upper portions 172 of the dielectric layer 170, in accordance with some embodiments. The spacer layer 290 covers the etch stop layer 280 over the top surfaces 274 of the spacer layers 270, in accordance with some embodiments.

In some embodiments, the removal process further removes upper portions of the etch stop layer 280, which is not covered by the spacer layer 290. Therefore, the etch stop layer 280, which is not covered by the spacer layer 290, has a thickness T1' less than the thickness T1 of the etch stop layer 280, which is covered by the spacer layer 290, in accordance with some embodiments. The removal process includes an etching process, such as an anisotropic etching process (e.g., a dry etching process), in accordance with some embodiments.

As shown in FIG. 1H, the etch stop layer 280, which is not covered by the spacer layer 290, is removed, in accordance with some embodiments. The removal process further removes the spacer layer 290 and the etch stop layer 280 over the top surfaces 274 of the spacer layers 270, in accordance with some embodiments. The removal process includes an etching process, such as an anisotropic etching process (e.g., a dry etching process), in accordance with some embodiments.

As shown in FIG. 1I, the dielectric layer 170, which is not covered by the etch stop layer 280, the spacer layers 270 and 290, and the magnetic tunnel junction cells C, is removed, in accordance with some embodiments. After the removal process, the etch stop layer 160 over the logic region 114 is exposed, in accordance with some embodiments.

The removal process further removes the spacer layer 290 covering upper portions 282a of the sidewalls 282 of the stop layer 280, in accordance with some embodiments. Therefore, the upper portions 282a are exposed by the spacer layer 290 after the removal process, in accordance with some embodiments. The sidewalls 284, 292 and 176 of the stop layer 280, the spacer layer 290, and the dielectric layer 170 are substantially coplanar, in accordance with some embodiments.

The etch stop layer 280 covers the sidewall M1 of the magnetic tunnel junction stack M, in accordance with some embodiments. The etch stop layer 280 is between the magnetic tunnel junction stack M and the spacer layer 290 and between the dielectric layer 170 and the spacer layer 290, in accordance with some embodiments.

The etch stop layer 280 is thick enough (greater than about 30 Å) so as to protect the magnetic tunnel junction stack M from damage caused by the removal process of the dielectric layer 170, which is not covered by the etch stop layer 280, the spacer layers 270 and 290, and the magnetic tunnel junction cells C, in accordance with some embodiments. Furthermore, the etch stop layer 280 is able to be used as a self-aligned etching mask during the removal process of the dielectric layer 170, which is not covered by the etch stop layer 280, the spacer layers 270 and 290, and the magnetic tunnel junction cells C, in accordance with some embodiments. Therefore, there is no need to form a photoresist mask layer for the removal process for defining the dielectric layer 170, which avoids the topography issue of a photoresist mask layer over the cell region 112 and the logic region 114, in accordance with some embodiments. As a result, the yield of the process for defining the dielectric layer 170 is improved, the process for defining the dielectric layer 170 is simplified, and the process cost is greatly reduced, in accordance with some embodiments.

As shown in FIG. 1J, a dielectric layer 310 is formed over the magnetic tunnel junction cells C, the etch stop layers 160 and 280, and the spacer layers 270 and 290, in accordance with some embodiments. The dielectric layer 310 surrounds the magnetic tunnel junction cells C, the etch stop layer 280, and the spacer layers 270 and 290, in accordance with some embodiments. The dielectric layer 310 over the cell region 112 has a thickness T3, in accordance with some embodiments. The dielectric layer 310 over the logic region 114 has a thickness T4, in accordance with some embodiments.

The dielectric layer 310 is made of an extreme low-k (ELK) dielectric material, in accordance with some embodiments. The k-value of the dielectric layer 310 is less than that of the dielectric layer 170, in accordance with some embodiments. The k-value of the dielectric layer 310 is less than about 2.5, in accordance with some embodiments. The extreme low-k (ELK) dielectric material includes a porous low-k material, in accordance with some embodiments.

The dielectric layer 310 is made of an oxide-containing material (e.g., silicon oxide or tetraethyl orthosilicate oxide), an oxynitride-containing material (e.g., silicon oxynitride), a glass material (e.g., borosilicate glass, phosphoric silicate glass, boron phospho-silicate glass, or fluorinated silicate glass), or a combination thereof, in accordance with some embodiments.

The dielectric layer 310 is formed using a chemical vapor deposition (CVD) process, such as a low-pressure CVD process, a plasma-enhanced CVD process, or a high-density plasma CVD process, an atomic layer deposition process, a spin-on process, a physical vapor deposition process, or another suitable process, in accordance with some embodiments.

As shown in FIG. 1J, a mask layer 320 is formed over the dielectric layer 310 over the logic region 114, in accordance with some embodiments. The mask layer 320 is made of a polymer material, such as a photoresist material, or another suitable material, in accordance with some embodiments.

As shown in FIG. 1K, the dielectric layer 310, which is not covered by the mask layer 320, is thinned, in accordance with some embodiments. The thickness T3' of the thinned dielectric layer 310 over the cell region 112 is reduced in contrast to the thickness T3 of the un-thinned dielectric layer 310 over the cell region 112 (as shown in FIG. 1J), in accordance with some embodiments. Therefore, the difference between the thicknesses T3' and T4 is reduced in contrast to the difference between the thicknesses T3 and T4 (as shown in FIG. 1J), which may eliminate some topography issues. The thinning process includes an etching process, such as a dry etching process, in accordance with some embodiments. As shown in FIG. 1K, the mask layer 320 is removed, in accordance with some embodiments.

As shown in FIG. 1L, a mask layer 320 is formed over the dielectric layer 310, in accordance with some embodiments. The mask layer 320 is made of a nitride-containing material, such as titanium nitride, or another suitable material, which is different from that of the dielectric layer 310, in accordance with some embodiments.

The mask layer 320 is formed using a chemical vapor deposition (CVD) process, such as a low-pressure CVD process, a plasma-enhanced CVD process, or a high-density plasma CVD process, an atomic layer deposition process, a physical vapor deposition process, or another suitable process, in accordance with some embodiments.

As shown in FIG. 1M, a mask layer 330 is formed over the mask layer 320, in accordance with some embodiments. The mask layer 330 has an opening 332, in accordance with some embodiments. The opening 332 exposes a portion of the mask layer 320 over the conductive line 146, in accordance with some embodiments. The mask layer 330 is made of a polymer material, such as a photoresist material, or another suitable material, in accordance with some embodiments.

As shown in FIG. 1M, the portion of the mask layer 320 under the opening 332 is removed to form an opening 322 in the mask layer 320, in accordance with some embodiments. The opening 322 exposes a portion of the dielectric layer 310 over the conductive line 146, in accordance with some embodiments. The removal process includes an etching process, such as a dry etching process, in accordance with some embodiments.

As shown in FIG. 1N, the mask layer 330 is removed, in accordance with some embodiments. As shown in FIG. 1N, a mask layer 340 is formed over the mask layer 320 and the dielectric layer 310, in accordance with some embodiments. The mask layer 340 has an opening 342, in accordance with some embodiments. The opening 342 exposes a portion of the dielectric layer 310 over the conductive line 146, in accordance with some embodiments. The mask layer 340 is made of a polymer material, such as a photoresist material, or another suitable material, in accordance with some embodiments.

As shown in FIG. 1N, the portion of the dielectric layer 310 over the conductive line 146 is partially removed through the opening 342, in accordance with some embodiments. The removal process includes an etching process, such as a dry etching process, in accordance with some embodiments.

As shown in FIG. 1O, the mask layer 340 is removed, in accordance with some embodiments. As shown in FIG. 1O, an anisotropic etching process is performed to partially remove the dielectric layer 310 through the opening 322, in accordance with some embodiments.

After the anisotropic etching process, a trench TR and a via hole V is formed in the dielectric layer 310, in accordance with some embodiments. The trench TR is over and communicates with the via hole V, in accordance with some embodiments. The via hole V passes through the etch stop layers 150 and 160, in accordance with some embodiments. The via hole V exposes the conductive line 146, in accordance with some embodiments.

As shown in FIG. 1P, a conductive layer 350a is formed over the dielectric layer 310 and in the trench TR and the via hole V, in accordance with some embodiments. The conductive layer 350a is made of a conductive material, such as metal (e.g., copper, aluminum, gold, silver, or tungsten) or alloys thereof, in accordance with some embodiments. The conductive layer 350a is formed using a deposition process (e.g., a physical vapor deposition process), in accordance with some embodiments.

As shown in FIG. 1Q, the conductive layer 350a outside of the trench TR and the via hole V is removed, in accordance with some embodiments. The remaining conductive layer 350a forms a conductive structure 350, in accordance with some embodiments. The conductive structure 350 includes a conductive line 352 and a conductive via 354 thereunder, in accordance with some embodiments.

The removal process further removes upper portions of the dielectric layer 310 and the top electrodes 252, in accordance with some embodiments. Therefore, the top surfaces 252a of the top electrodes 252, a top surface 312 of the dielectric layer 310, and a top surface 352a of the conductive line 352 are substantially coplanar after the removal process, in accordance with some embodiments.

In accordance with some embodiments, memory device structures and methods for forming the same are provided. The methods (for forming the memory device structure) form a thick etch stop layer over sidewalls of a magnetic tunnel junction cell and a dielectric layer over a cell region of a substrate and then etching the dielectric layer over a logic region of the substrate using the thick etch stop layer as an etching mask. The etch stop layer is thick enough so as to protect the magnetic tunnel junction cell from damage caused by the etching process of the dielectric layer. Furthermore, the etch stop layer is able to be used as a self-aligned etching mask during the etching process. Therefore, there is no need to form a photoresist mask layer for the etching process for defining the dielectric layer, which avoids the topography issue of a photoresist mask layer over the cell region and the logic region. As a result, the yield of the process for defining the dielectric layer is improved, the process for defining the dielectric layer is simplified, and the process cost is greatly reduced.

In accordance with some embodiments, a method for forming a memory device structure is provided. The method includes providing a substrate, a first dielectric layer, a conductive via, a magnetic tunnel junction cell, a first etch stop layer, and a first spacer layer. The substrate has a first region and a second region, the first dielectric layer is over the substrate, the conductive via passes through the first dielectric layer over the first region, the magnetic tunnel junction cell is over the conductive via, the first etch stop layer covers the first dielectric layer and the magnetic tunnel junction cell, and the first spacer layer is over the first etch stop layer surrounding the magnetic tunnel junction cell and a first upper portion of the first dielectric layer. The method includes removing the first etch stop layer, which is not covered by the first spacer layer. The method includes removing the first dielectric layer, which is not covered by the first etch stop layer.

In accordance with some embodiments, a method for forming a memory device structure is provided. The method includes providing a substrate, a dielectric layer, a conductive via, a bottom electrode, a magnetic tunnel junction stack, a top electrode, an etch stop layer, and a spacer layer. The substrate has a first region and a second region, the dielectric layer is over the substrate, the conductive via passes through the dielectric layer over the first region, the bottom electrode, the magnetic tunnel junction stack, and the top electrode are sequentially stacked over the conductive via, the spacer layer surrounds the magnetic tunnel junction stack, the bottom electrode, and a first upper portion of the dielectric layer, and the etch stop layer covers a first sidewall of the magnetic tunnel junction stack and is between the magnetic tunnel junction stack and the spacer layer and between the dielectric layer and the spacer layer. The method includes removing the dielectric layer, which is not covered by the etch stop layer.

In accordance with some embodiments, a memory device structure is provided. The memory device structure includes a substrate having a first region and a second region. The memory device structure includes a first etch stop layer over the substrate. The memory device structure includes a first dielectric layer over the first etch stop layer and over the first region. The memory device structure includes a conductive via passing through the first dielectric layer and the first etch stop layer. The memory device structure includes a magnetic tunnel junction cell over the conductive via. The memory device structure includes a second etch stop layer surrounding the magnetic tunnel junction cell and a first upper portion of the first dielectric layer. The second etch stop layer is thicker than the first etch stop layer. The memory device structure includes a spacer layer surrounding the second etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device structure, comprising:
    providing a substrate, a first dielectric layer, a conductive via, a magnetic tunnel junction cell, a first etch stop layer, and a first spacer layer, wherein
    the substrate has a first region and a second region, the first dielectric layer is over the substrate, the conductive via passes through the first dielectric layer over the first region, the magnetic tunnel junction cell is over the conductive via, the first etch stop layer covers the first dielectric layer and the magnetic tunnel junction cell, and the first spacer layer is over the first etch stop layer surrounding the magnetic tunnel junction cell and a first upper portion of the first dielectric layer;
    removing the first etch stop layer, which is not covered by the first spacer layer; and
    removing the first dielectric layer, which is not covered by the first etch stop layer.

2. The method for forming the memory device structure as claimed in claim 1, further comprising:
    providing a second etch stop layer over the substrate, wherein the first dielectric layer is over the second etch stop layer, the conductive via further passes through the second etch stop layer, the second etch stop layer over the second region is exposed after the removing of the first dielectric layer, which is not covered by the first etch stop layer, and the first etch stop layer is thicker than the second etch stop layer.

3. The method for forming the memory device structure as claimed in claim 2, further comprising:
    forming a second dielectric layer over the magnetic tunnel junction cell, the first etch stop layer, the first spacer layer, and the second etch stop layer after removing the first dielectric layer, which is not covered by the first etch stop layer;
    removing a portion of the second dielectric layer over the second region to form a trench and a via hole in the second dielectric layer, wherein the trench is over and communicates with the via hole;
    forming a conductive layer over the second dielectric layer and in the trench and the via hole; and
    removing the conductive layer outside of the trench and the via hole.

4. The method for forming the memory device structure as claimed in claim 3, wherein the removing of the conductive layer outside of the trench and the via hole further comprises removing a second upper portion of the second dielectric layer and a third upper portion of the magnetic tunnel junction cell.

5. The method for forming the memory device structure as claimed in claim 4, wherein a first top surface of the magnetic tunnel junction cell, a second top surface of the second dielectric layer, and a third top surface of the conductive layer are substantially coplanar after the removing of the conductive layer outside of the trench and the via hole, the second upper portion of the second dielectric layer, and the third upper portion of the magnetic tunnel junction cell.

6. The method for forming the memory device structure as claimed in claim 5, wherein the magnetic tunnel junction cell comprises a bottom electrode, a magnetic tunnel junction stack, and a top electrode sequentially stacked over the conductive via, and the top electrode has the first top surface.

7. The method for forming the memory device structure as claimed in claim 1, further comprising:
    providing a second spacer layer between the magnetic tunnel junction cell and the first etch stop layer and between the first upper portion of the first dielectric layer and the first etch stop layer, wherein the removing of the first etch stop layer, which is not covered by the first spacer layer, further comprises removing the first etch stop layer over an upper surface of the second spacer layer.

8. The method for forming the memory device structure as claimed in claim 7, wherein the first etch stop layer conformally covers the first dielectric layer, the second spacer layer and the magnetic tunnel junction cell before removing the first etch stop layer, which is not covered by the first spacer layer.

9. The method for forming the memory device structure as claimed in claim 1, wherein a first sidewall of the first etch stop layer and a second sidewall of the first dielectric layer are substantially coplanar after removing the first dielectric layer, which is not covered by the first etch stop layer.

10. The method for forming the memory device structure as claimed in claim 9, wherein a third sidewall of the first spacer layer and the first sidewall of the first etch stop layer are substantially coplanar after removing the first dielectric layer, which is not covered by the first etch stop layer.

11. A method for forming a memory device structure, comprising:
    providing a substrate, a dielectric layer, a conductive via, a bottom electrode, a magnetic tunnel junction stack, a top electrode, an etch stop layer, and a spacer layer, wherein
    the substrate has a first region and a second region, the dielectric layer is over the substrate, the conductive via passes through the dielectric layer over the first region, the bottom electrode, the magnetic tunnel junction stack, and the top electrode are sequentially stacked over the conductive via, the spacer layer surrounds the magnetic tunnel junction stack, the bottom electrode, and a first upper portion of the dielectric layer, and the etch stop layer covers a first sidewall of the magnetic tunnel junction stack and is between the magnetic tunnel junction stack and the spacer layer and between the dielectric layer and the spacer layer; and removing the dielectric layer, which is not covered by the etch stop layer.

12. The method for forming the memory device structure as claimed in claim 11, wherein the first sidewall of the magnetic tunnel junction stack, a second sidewall of the bottom electrode, and a third sidewall of the top electrode are substantially coplanar.

13. The method for forming the memory device structure as claimed in claim 11, wherein the removing of the dielectric layer, which is not covered by the etch stop layer, further comprises removing the spacer layer covering a second upper portion of a second sidewall of the etch stop layer.

14. The method for forming the memory device structure as claimed in claim 11, wherein the providing of the etch stop layer and the spacer layer comprises:
   depositing the etch stop layer over the dielectric layer, the bottom electrode, the magnetic tunnel junction stack, and the top electrode;
   depositing a spacer material layer over the etch stop layer;
   removing the spacer material layer over the top electrode and the second region to form the spacer layer; and
   removing the etch stop layer, which is not covered by the spacer layer.

15. The method for forming the memory device structure as claimed in claim 14, wherein the removing of the spacer material layer over the top electrode and the second region further comprises removing a second upper portion of the etch stop layer over the top electrode and the second region.

16. A memory device structure, comprising:
   a substrate having a first region and a second region;
   a first etch stop layer over the substrate;
   a first dielectric layer over the first etch stop layer and over the first region;
   a conductive via passing through the first dielectric layer and the first etch stop layer;
   a magnetic tunnel junction cell over the conductive via;
   a second etch stop layer surrounding the magnetic tunnel junction cell and a first upper portion of the first dielectric layer, wherein the second etch stop layer is thicker than the first etch stop layer; and
   a first spacer layer surrounding the second etch stop layer;
   a second spacer layer surrounding the magnetic tunnel junction cell and between the second etch stop layer and the magnetic tunnel junction cell; and
   a second dielectric layer over the first etch stop layer and surrounding the magnetic tunnel junction cell, the first dielectric layer, the conductive via, the second etch stop layer, and the first spacer layer, wherein the second spacer layer is in direct contact with the second dielectric layer.

17. The memory device structure as claimed in claim 16, wherein a first sidewall of the second etch stop layer and a second sidewall of the first dielectric layer are substantially coplanar, the first sidewall is over and connected to the second sidewall, and both the first sidewall and the second sidewall face away from the conductive via.

18. The memory device structure as claimed in claim 17, wherein a third sidewall of the first spacer layer and the first sidewall of the second etch stop layer are substantially coplanar.

19. The memory device structure as claimed in claim 16, wherein the first etch stop layer and the second etch stop layer are made of a same material.

20. The memory device structure as claimed in claim 16, further comprising:
   a conductive structure passing through the second dielectric layer and the first etch stop layer over the second region, wherein a first top surface of the magnetic tunnel junction cell, a second top surface of the second dielectric layer, and a third top surface of the conductive structure are substantially coplanar, and the second etch stop layer and the first spacer layer are in direct contact with the second dielectric layer.

* * * * *